US008360636B2

United States Patent
Sato et al.

(10) Patent No.: US 8,360,636 B2
(45) Date of Patent: Jan. 29, 2013

(54) TEMPERATURE DETECTION AND REPORTING SYSTEM AND METHOD IN POWER DRIVING AND/OR CONSUMING SYSTEM

(75) Inventors: Tetsuo Sato, San Jose, CA (US); Ryotaro Kudo, Takasaki (JP)

(73) Assignee: Renesas Electronics America Inc., Santa Clara, CA (US)

( * ) Notice: Subject to any disclaimer, the term of this patent is extended or adjusted under 35 U.S.C. 154(b) by 668 days.

(21) Appl. No.: 12/574,588

(22) Filed: Oct. 6, 2009

(65) Prior Publication Data

US 2011/0002358 A1    Jan. 6, 2011

Related U.S. Application Data

(60) Provisional application No. 61/222,910, filed on Jul. 2, 2009.

(51) Int. Cl.
   *G01K 7/00*    (2006.01)
(52) U.S. Cl. .................................. 374/170; 374/163
(58) Field of Classification Search .................. 374/163, 374/170
   See application file for complete search history.

(56) References Cited

U.S. PATENT DOCUMENTS

| 4,749,416 | A  | * | 6/1988  | Greenspan ..................... 374/140 |
| 6,104,011 | A  | * | 8/2000  | Juliano ........................ 374/179 |
| 7,871,198 | B2 | * | 1/2011  | Rempe et al. ................. 374/179 |
| 7,874,726 | B2 | * | 1/2011  | Jacobs et al. ................. 374/179 |
| 7,946,762 | B2 | * | 5/2011  | Yednak, III .................... 374/179 |
| 8,100,583 | B2 | * | 1/2012  | Conner et al. ................ 374/179 |
| 2008/0205483 | A1 | * | 8/2008 | Rempe et al. ................. 374/179 |
| 2008/0289574 | A1 | * | 11/2008 | Jacobs et al. ................. 118/708 |
| 2009/0052498 | A1 | * | 2/2009 | Halpin et al. ................. 374/179 |
| 2009/0308425 | A1 | * | 12/2009 | Yednak, III .................... 136/230 |
| 2010/0145547 | A1 | * | 6/2010 | Darabnia et al. ............. 374/179 |
| 2010/0284438 | A1 | * | 11/2010 | Aggarwal et al. ............. 374/179 |

* cited by examiner

*Primary Examiner* — Yaritza Guadalupe-McCall
(74) *Attorney, Agent, or Firm* — Campbell Stephenson LLP

(57) ABSTRACT

An apparatus, in one embodiment, can include a configuration including a plurality of heat generation devices. The apparatus also includes a plurality of thermal sensors respectively, operably connected to each of the plurality of heat generation devices, wherein each thermal sensor of the plurality of thermal sensors includes a respective output terminal configured to provide a voltage representative of the temperature of the respective heat generation device. The apparatus further includes an output circuit configured to output the highest temperature information among the heat generation devices. The output terminals of the plurality of thermal sensors are tied together. A corresponding method is also discussed.

18 Claims, 6 Drawing Sheets

Temp Sense & Driver with Enable Control

FIG.2

FIG.3  4-Phase VR Temp Simulation

FIG.4  Temp Sense 4-Phase TR

FIG.5  Temp Sense and Drive Method

FIG.6  Temp Sense and Drive Circuit

FIG.7  Temp Sense & Drive with Enable Control

FIG.8  Temp Sense & Driver with Enable Control

TEMPERATURE DETECTION AND REPORTING SYSTEM AND METHOD IN POWER DRIVING AND/OR CONSUMING SYSTEM

CROSS REFERENCE TO RELATED APPLICATIONS

This application claims the benefit of U.S. Provisional Patent Application No. 61/222,910 filed Jul. 2, 2009, the entire disclosure of which application is incorporated herein by reference.

BACKGROUND

1. Field

The present invention generally relates to electronics. More specifically, certain embodiments of the present invention relate temperature detection and reporting systems. By the use of particular embodiments of this invention, one can easily and correctly detect the highest temperature generated in power driving and/or consuming system.

2. Description of the Related Art

One of the concerns in certain areas of electronics is to measure the temperature of electronic components. For one example, in multi-phase Voltage Regulator (VR) design, sensing the highest temperature device of the VR board can be helpful to ensure VR safety operation or long life reliability. Thus, for example, in certain electronics systems, the system needs the most critical and hottest thermal information first. Having the hottest thermal information first may be important since the hottest temperature may be the best indication of potential malfunction or risk of hardware damage. For this purpose, in VR board design, a designer typically measures the board temperature under heavy load condition to find the highest temperature device on the board. Then the designer sets a temperature sensor, such as a thermistor, to monitor the temperature of that device. The exact hottest location information would have a lower priority if it were not necessary to position the thermistor accurately.

Currently, a thermistor is used for temperature sensing for discrete MOSFET-based Voltage Regulators (VRs) or power System-in-Package (SiP) type devices for VR.

In a conventional thermistor detection case, in the design stage, one needed to identify (via temperature measurements) the highest temperature component and then arrange the layout of the components so that the temperature sensor is near (physically proximate to) the highest-temperature component. Additionally, one had to depend on airflow strength and path or MOSFET efficiency versus various condition changes, as the hottest device and location may change from original estimation. To avoid the foregoing issues, multiple thermistor sensors could be used, but would tend to increase cost and require multiple Analog-to-Digital converters (A/Ds) and input terminals in the controller of the voltage regulator.

Certain systems, particularly in the areas of evolving and emerging technologies, may benefit from the support of critical temperature reporting systems. Thus, there may be value in practical approaches to providing critical temperature reporting systems.

SUMMARY OF THE INVENTION

One embodiment of the present invention is an apparatus. The apparatus includes a power driving system (sometimes referred to as a configuration) including a plurality of drivers. The apparatus also includes a plurality of thermal sensors respectively, operably connected to each of the plurality of drivers. Each thermal sensor of the plurality of thermal sensors includes a respective output terminal configured to provide a voltage representative of the temperature of the respective driver. The apparatus further includes an output circuit configured to output the highest temperature information among the drivers. The output terminals of the plurality of thermal sensors are tied together.

Another embodiment of the present invention includes an apparatus. The apparatus includes a power consuming block means including a plurality of circuit blocks that consumes power. The apparatus also includes a plurality of respective thermal sensing means for sensing temperature, operably connected to each of the plurality of power consuming block means. Each thermal sensing means of the plurality of thermal sensing means includes a respective output provision means for providing a voltage representative of the temperature of the respective power consuming block means. The apparatus further includes an output means for outputting the highest temperature information among the phase voltage regulating means. The output provision means of the plurality of thermal sensing means are tied together.

A further embodiment of the present invention is a method The method includes consuming power by a plurality of nodes daisy chain connected by at least one wire. The method also includes sensing temperature with a plurality of thermal sensors respectively, operably connected to each of the plurality of nodes, wherein each thermal sensor of the plurality of thermal sensors includes a respective output terminal configured to provide a voltage representative of the temperature of the respective node, wherein the output terminals of the plurality of thermal sensors are tied together. The method further includes outputting, via an output circuit, an extreme temperature information among the nodes.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only some embodiments of the invention and are not therefore to be considered to be limiting of its scope, the invention will be described and explained with additional specificity and detail through the use of the accompanying drawings, in which.

DETAILED DESCRIPTION OF THE PREFERRED EMBODIMENT(S)

It will be readily understood that the components of the invention, as generally described and illustrated in the figures herein, may be arranged and designed in a wide variety of different configurations. Thus, the following more detailed description of the embodiments of the apparatus, system, and method of the invention, as represented in the attached figures, is not intended to limit the scope of the invention, as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

In certain embodiments of the present invention, in a system including a multi-part heat generation block, each heat generation block can have a thermal sensor circuit to measure the temperature of the block and at least one output terminal that provides a voltage representative of the block temperature. Each block temperature output terminal is tied or operatively connected to the other output terminals, in particular embodiments of the present invention, in order to find the hottest temperature information. Thus, in certain embodiments, the system uses only one output and data line to report the hottest temperature information.

Thus, in certain embodiments, a method is realized in a circuit block diagram involving at least three terminals. The at least three terminals are source voltage source (Vcc), sink source (GND), and temperature output terminal (Vt). A thermal sensing circuit is also included in these embodiments. When multiple Vt terminals are appropriately connected to each other, the voltage Vt represents the highest sensed temperature.

Certain embodiments of the present invention can measure the hottest temperature first, or can measure only the hottest temperature. Also, certain embodiments can avoid an issue where the device (e.g. the phase VR) that has the highest temperature within a package (e.g. a single chip including a phase VR and related circuitry) is not necessarily always the same device. Furthermore, certain embodiments of the present invention can avoid having to detect the exact maximum heat-generating device during the design stage of the voltage regulator (e.g. multi-phase or multi-rail voltage regulator). In multi-phase voltage regulation, in certain embodiments, each phase VR has a thermal sensor circuit and at least one output terminal that outputs voltage representing the VR temperature. Certain embodiments tie or operably connect each of the VR thermal output terminals together to obtain the hottest temperature information.

Certain embodiments of the present invention may simplify circuit design by obviating the need to measure the highest component temperature in design, and may also provide advantages in terms of automatically detecting the highest temperature component even when environmental conditions change. Also, the Pulse Width Modulation (PWM) controller may need only one A/D converter and one input terminal and may be implemented using a simple connection, since the PWM controller may receive a single temperature reading from the tied or operably connected output terminals.

Figure 1A:
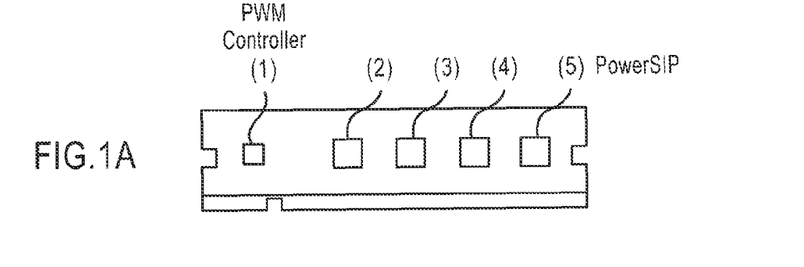
FIG. 1 shows a photo of a 4-phase Voltage Regulator Module (VRM) top and bottom view.
Figure 1B:
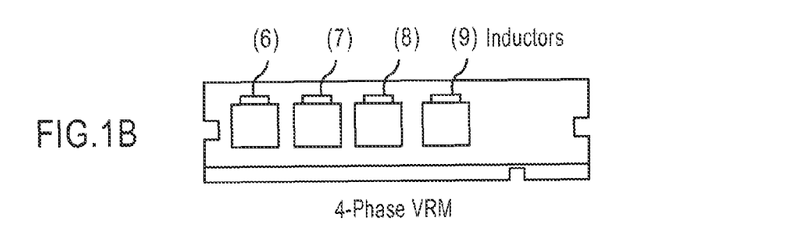

FIG. 1 shows a typical multi-phase Voltage Regulator (VR) Module (VRM). The multi-phase VR shown in FIG. 1 is useful for server applications to supply 1~1.5V over 100 A from a Vcc 12V line. In FIG. 1, a 4-phase example is shown, although the present invention is not limited to applications involving 4-phase VRMs. In this Figure, (1) is a pulse-width-modulation (PWM) controller, (2)~(5) are power systems-in-packages (SiPs) which can accommodate High-Side and Low-Side MOSFETs and a Driver in one package, and (6)~(9) are output inductors. This VRM is typically located as close as possible to a load, such as a Central Processing Unity (CPU) or a memory. Close location may help to reduce IR drop between the CRM and the load. Therefore, VRMs are often designed to be as small in size as possible. High power handling and small size can make thermal design and monitoring difficult.

Figure 2:
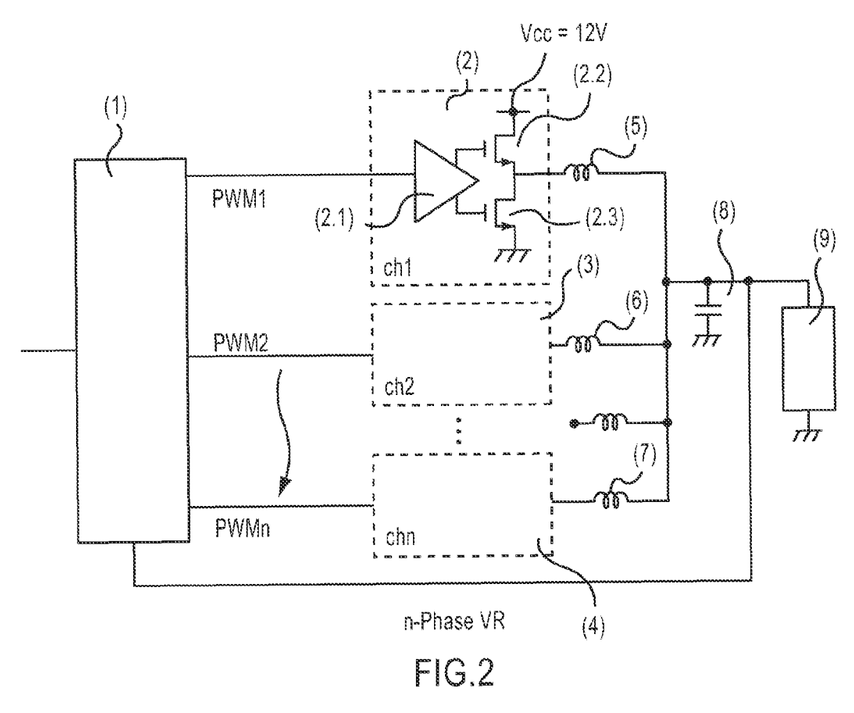
FIG. 2 shows an n-phase VR block diagram using Power SiP (a device having High-Side MOS, Low-Side MOS and Driver in one package).

In FIG. 2, (1) illustrates a PWM controller to drive Power SiP multi-phase operation and (2)~(4) are Power SiPs. Also, (2.1) is a driver, (2.2) is a High-Side MOSFET and (2.3) is a Low-Side MOSFET. Additionally, (5)~(7) are output inductors, (8) is an output capacitor and (9) is a load. In the example shown in FIG. 2, when the PWM is High, the current "i" flows in from Vcc to High-Side MOSFET (2.2) to Inductor (5) to Load (9) to GND (ground).

$$Ldi/dt1 = Vcc - Vout$$

When PWM is low, High-Side MOSFET (2.2) is OFF and Low-Side MOSFFT (2.3) is ON. The current "i" flows in from GND to Inductor (5) to Load (9) and back to GND.

$$Ldi/dt2 = Vout$$

Hence $$Vout/Vcc = dt1/(dt1+dt2) = duty$$

Furthermore, the PWM for each phase (PWM1~n) has almost same duty cycle as the other phases to produce the same output voltage and share the current equally, at least in theory.

Figure 3:
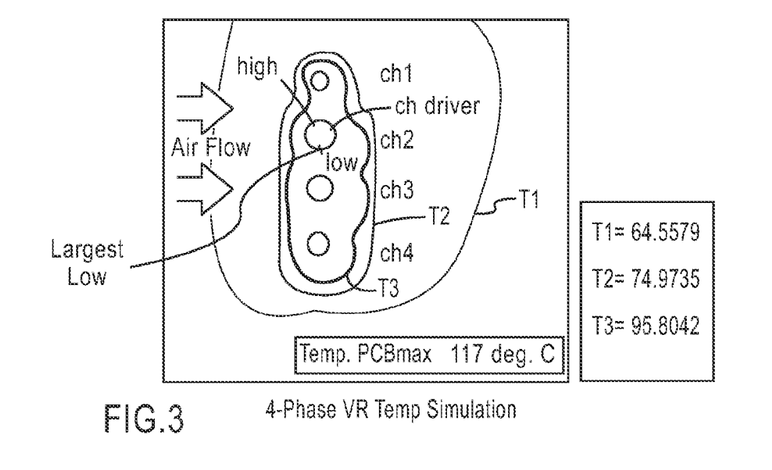
FIG. 3 shows a temperature simulation result for an embedded 4-phase VR with Io=100 A and operation with weak airflow conditions.

FIG. 3 shows a thermal simulation result of an embedded 4-phase VR at 100 A with weak airflow conditions. Even though each phase VR consumes almost the same power, depending on the location and environmental conditions the highest temperature device can change. There is a difference, for instance, in temperature in FIG. 3 between Ch1 and Ch3, which are at different temperatures because they are at different locations and receive slightly different airflows.

Designers usually consider that the highest temperature of a device may be limited by the maximum junction temperature of the silicon device. From a reliability point of view, the designer may also need to consider printed circuit board (PCB) surface temperature. Once the system detects a critical high temperature, the system controller (e.g. the PWM controller) may speed up the air fan or reduce the load's required power to ensure safety in operation and avoid damage to the components.

Figure 4:
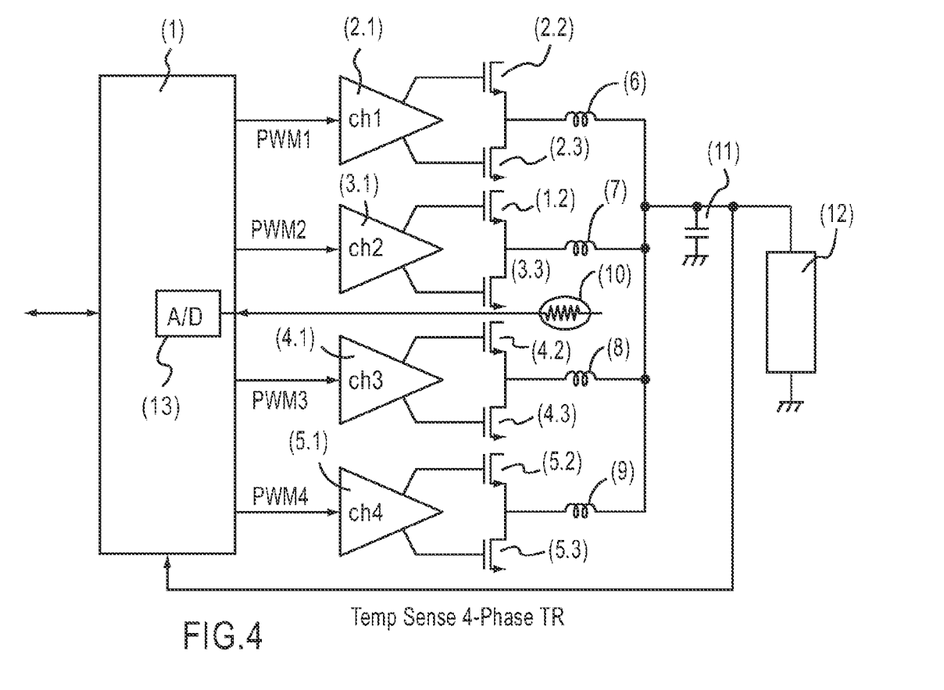
FIG. 4 shows a typical 4-phase VR with a thermistor temperature sensor.

For this purpose, FIG. 4 shows a temperature sensing example. In a conventional system one can mount a thermistor (10) on the highest temperature device in order to monitor the temperature of that device. This technology may impose several constraints. First, the designer may need to know a priori the highest temperature device so as to properly mount the thermistor. However, which device has the highest temperature may change according to environmental conditions such as airflow strength, airflow path, components density, box size, PCB size or the like. Thus, there may need to be some location adjustment in a final set test. Additionally, if the selection is not correct, the thermistor may provide an inaccurate reading of a device that is not the hottest device.

Additionally, the thermistor cannot detect precisely the exact junction temperature of the power device, but instead can only measure the environmental temperature outside the package. Although it may not be critical to know the exact junction temperature, the thermistor's reading of the temperature is relatively indirect, as various factors such as conduction and convection may prevent good thermal coupling between the thermistor and the device whose temperature it is intended to sense.

Certain devices can have more or fewer phases operational at a time. It should be apparent that temperature conditions will necessarily be different when a single phase is operational as compared to when two or four phases are operational. This phase shedding condition can prevent a single thermistor from providing sufficient data, leading to the need to include multiple thermistors, one for each phase.

Certain embodiments of the present invention, embodiments that do not require a thermistor, can circumvent at least some of the above-identified concerns. Specifically, certain embodiments of the present invention can be implemented within a package rather than simply close to the package. Thus, certain embodiments of the present invention employ no thermistors in the temperature sensing of the voltage regulator.

Figure 5:
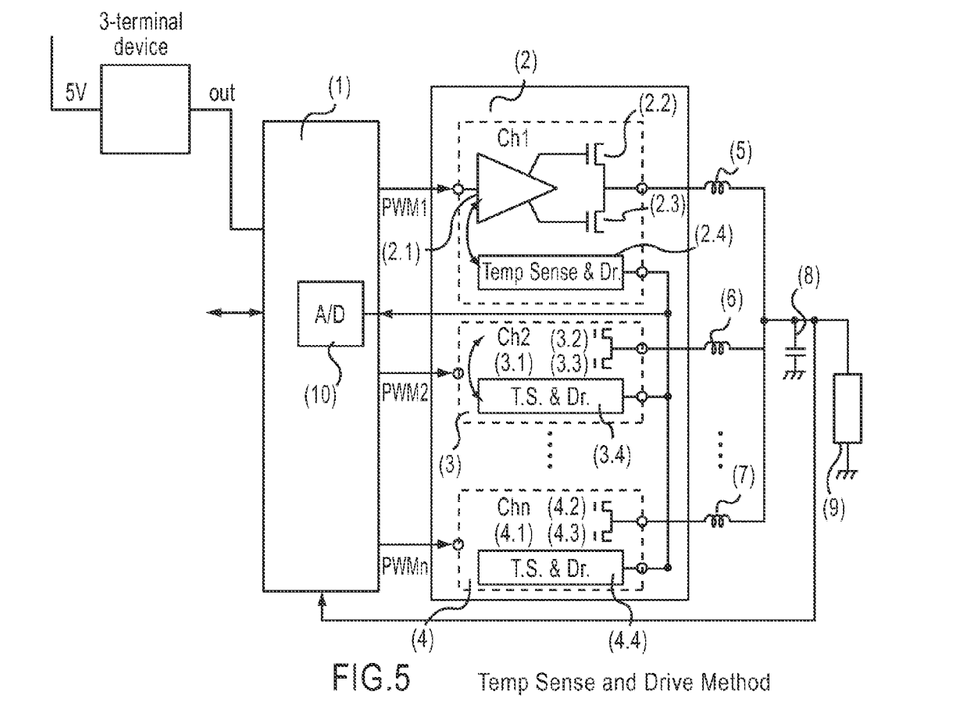
FIG. 5 illustrates an n-phase VR block diagram with one wire connecting temperature detection and information system, in accordance with an embodiment of the present invention.

FIG. 5 shows a new temperature sensing and drive method for VR systems, according to certain embodiments of the present invention. As shown in FIG. 5, each Power SiP (2)~(4) has a temperature sensing and drive circuit (2.4)~(4.4) (shown as a block, detail will be provided below of certain embodiments of this block). This circuit can detect the temperature inside of a package and can be manufactured with the same die as the driver chip (2.1)~(4.1). The driver chip can be located beside High-Side MOSFET (2.2)~(4.2) and Low-Side MOSFET (2.3)~(4.4) in the package, and can be well thermal coupled to the MOSFETs. The temperature drive circuit can have at least one output terminal to tie to other output terminals. The driver can monitor the tied information and compare sensing temperature information. If the sensed temperature is higher than the tied information, the output circuit can hold the sensed temperature information. If the tied information is higher than sensed information, the output circuit can keep the tied information to its original level. Thus, among the tied information, the highest value is sent to the Pulse Width Modulator Integrated Circuit (PWMIC) or other controller as the highest temperature information.

When this application speaks of the output terminals being tied, this is to be understood broadly. For example, in some embodiments discussed below, the tying is via an Operational Amplifier (OP Amp) circuit, although other functionally similar operational connections are also permitted within the concept of tying.

As noted above, in FIG. 5 (1) is a multi-phase PWM controller and (2)~(4) are dc-dc power converters for multi-phase VR. Each dc-dc power convertor in this example has a temperature sensor and drive circuit (2.4),(3.4)~(4.4) and one temperature information output terminal. The output terminals are tied and operatively connected to an A/D (analog to digital) convertor of the PWM controller. The PWM controller, in this example, communicates with a system controller to report the hottest temperature data.

The PWM Controller (1) can create PWM pulses (PWM1, 2, . . . n) to generate a desired output voltage to the load (9) and to keep current sharing on the various channels (Ch1~n) equal. Ch1~n are multi-phase VRs, in which each PWM is phase shifted $2\pi/n$ (this is one example, but is not necessarily required for practice of the invention). Ch1 accommodates PWM driver (2.1) for High-Side (2.2) & Low-Side (2.3) MOSFET and (in this example) Temperature Sense and Drive circuit (2.4), which is on the same die of PWM driver (the "same die" aspect is simply one embodiment of the present invention). Temperature Sense (or "Temperature Sensing"—the two concepts are equivalent) and Drive circuit can have at least one output terminal. The temperature output terminals can be tied each other by one connection pattern. Through tying the output terminals to each other, the circuit can automatically select the highest temperature information as output data. The A/D convertor of a PWMIC or a system control microcontroller unit (MCU) can read this temperature data. Output inductor (5) and capacitor (8) can be connected to an output terminal.

Figure 6:
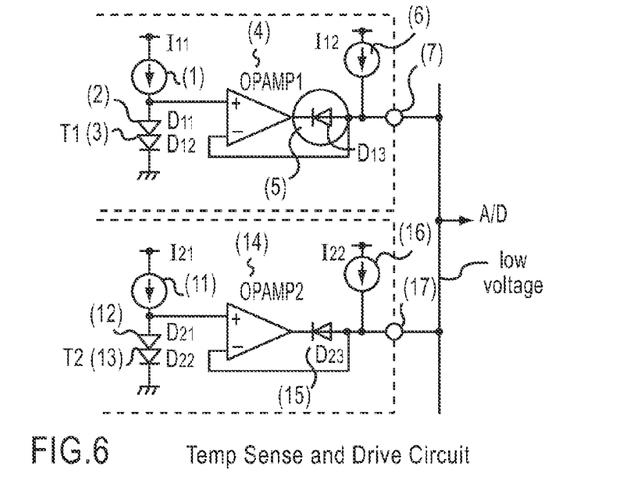
FIG. 6 illustrates a detail circuit description of a temperature sensing and one wire driving circuit, in accordance with an embodiment of the present invention.

FIG. 6 shows an example of a temperature sensor and drive circuit. The temperature of the MOSFET is detected by an on-package sensing device D11, D12. Diode forwarding voltage can have, for example, ~−2 mV/° C. temperature dependency. If VF(@25 C)=650 mV and T1 block MOSFET temperature teaches 100 C, the diodes voltage D11+D12 cam go to (650−2(100−25))×2=1000 mV.

In this example, 500 mV feeds to the OPAmp1 (+) (positive) input. If T2 block MOSFET temperature is 105° C., the diodes voltage D21+D22 goes to (650−2(105−25))×@=980 mV. These two outputs (7)(17) can be tied each other, so the common voltage is fixed to the lower voltage as 980 mV. OPAmp1 (+)input=1000 mV and (−) (negative) input=980 mV, so OPAmp1 output rises up to ~Vcc but output diode D13 blocks the output current flow out from OPAmp output to terminal (7). In this manner, the output temperature signal is selected to be the lowest voltage, which translates to the highest temperature information. Thus, the tying of the output terminals can be performed through this example OP Amp circuit.

In FIG. 6, T1 and T2 are built-in different Power SiPs. For T1, the bias current I11 (1) flow into Silicon PN junction diodes D11 (2) and D12 (3), which results in the generation of forwarding voltage as a temperature sensing voltage. The OP Amp1 (4) (+) input receives this sensing voltage and the (−) input is connected to the output terminal (7). OP Amp1 output connects to diode D13 (5) cathode then anode connects to output terminal. A pull-up current source 112 (6) connects to the output terminal. T2 has essentially the same circuit as T1. Block T1 and T2 ( . . . Tn) outputs are then tied to each other.

It should be noted that in FIG. 6, I11 is the bias forwarding current of diodes.

$$Vf(D11)+Vf(D12)=2*ln(I11/Is)*kT/q$$

Is; saturation current
K; Boltzmann Function 1.3806 E-23 (J/Kelvin)
T; Temperature Kelvin
q; Electric charge Approximately the sensed voltage Vf(D11)+Vf(D12) may be 1.2V (room temperature) and can, in this example, have ~−4 mV/° C. temperature dependency.

For example, in FIG. 6, if T1 block is 100° C. and T2 block is 110° C., OP Amp 1 and 2 (+) input voltages are below.

OP Amp1 (+) input; 1.20−(100−25)*0.004=0.90 (V)
OP Amp2 (+) input; 1.20−(110−25)*0.004=0.86 (V)

If there is no output voltage lower than 0.86V, OP Amp 1 drives the output voltage (17) to 0.86V. OP Amp2 works as unity gain amplifier, OP Amp2 (−) input voltage is 0.86V and OP Amp2 output voltage is ~0.43V.

On the other hand, OP Amp1 (−) input is 0.86V, so OP Amp1 output voltage will be ~Vcc (or Vomax) and D13 is cut off because of reverse bias. OP Amp1, thus, works as an open loop gain circuit.

This circuit drives the lowest OP Amp (+) input voltage to the output terminal only so as to tie the output terminals to each other. In this particular example, the lowest voltage represents the highest temperature. To achieve exact same temperature detection voltage between different dies, one may need to employ on-chip trimming of I11(I21). Thus, in certain embodiments of the present invention on-chip trimming is implemented to standardize temperature detection voltages.

For a system, it may be more important to detect the highest temperature value and not necessarily as important to define the exact component to reach that temperature. However, if such component-level information is needed, an enhancement to the basic circuitry outlined above is possible. For example, it is possible to identify the exact component by using Enable/Disable control to the driver circuit. For example, if one selects OP Amp1 as enabled and sets disable for another OP Amp (OP Amp 2, 3, . . . n), one can select to read T1 block temperature. Using the same technique, one can monitor each block temperature through selective disabling. Likewise, if it is believed that a sense circuit is providing faulty information it could be disables using this mechanism.

Figure 7:
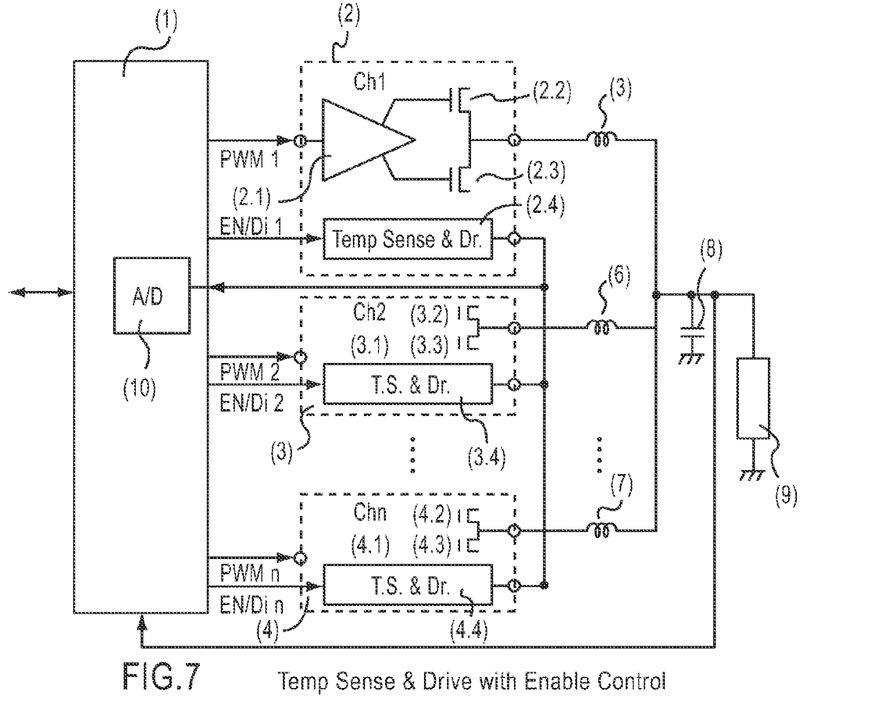
FIG. 7 illustrates with a block diagram a circuit with an Enable (or Disable) function, in accordance with an embodiment of the present invention.

FIG. 7 illustrates a block diagram of another example of embodiment. Each Temperature Sense and Drive ("T.S. & Dr.") block is controlled by Enable/Disable signal from PWM Controller or system control MCU. When all of Enable/Disable signal selects "Enable", system works as the highest temperature sensing systems. If only one Enable/Disable signal selects "Enable" and others to "Disable", the system can measure the individual channel temperatures. In the same manner, time sharing Enable/Disable control can detect exact temperature of every channel.

Figure 8:
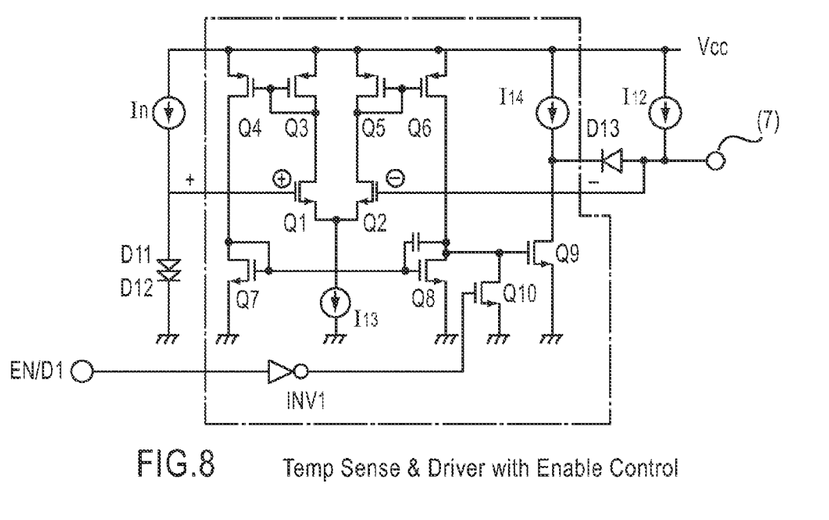
FIG. 8 illustrate a detail circuit of one Temperature Sensor & Driver block with Enable/Disable functionality, in accordance with an embodiment of the present invention.

FIG. 8 illustrates another embodiment of a of temperature sense and driver with enable control. The bias current I11 flows into Silicon PN junction diodes D11 and D12 generates forwarding voltage as a temperature sensing voltage in this example. Nch (n channel) MOSFET Q1, Q2 works a differential amplifier and converts Q1 gate to Q2 gate input voltage to provide signal current. I13 is the current source of the differential amplifier in this example. Q1 drain current can be mirrored by Pch Q3, Q4 current mirror and Q2 drain current can be mirrored by Pch Q5, Q6 current mirror. In this example, Q3 current is also held-back by Nch Q7, Q8 current mirror. The bias currents of Q6 and Q8 are roughly the same but signal current can change on Q6 and Q8 drain voltage with very high voltage gain. This signal voltage can serve as input of Q9. Q9 drain is the output of the OP Amp which has Q1 gate (+) and Q2 gate (−) input.

I14 is the bias current source of Q9 in this particular example. D13 is the diode between OP Amp output and output terminal (7). I12 is a current source to pull up the output terminal. Nch Q10 is the switch to control Enable/Disable. When Q10 is ON, the drain current of Q6 will short to GND and Q9 will be cut off. Q9 drain voltage will be Vcc and D13 will be cut off by reverse bias in this particular example, when the circuit operates as expected. The temperature drive circuit becomes inactive under such conditions. Enable/Disable 1 input signal connects to INV to control Q10. This is only one example of the exact circuit implementation, and is not limiting.

Figure 9:
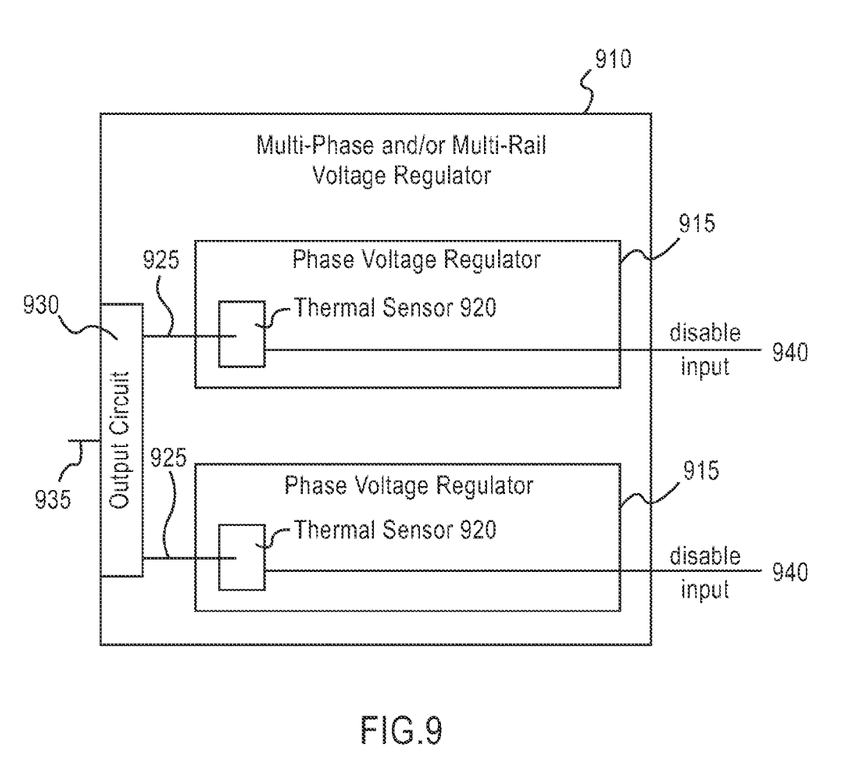
FIG. 9 illustrates an apparatus using a high-level block diagram, in accordance with an embodiment of the present invention.

FIG. 9 illustrates an apparatus according to an embodiment of the present invention using a high-level block diagram. As shown in FIG. 9, the apparatus can include a multi-part (i.e. multi-phase or multi-rail, in which each rail can be either single phase or multi-phase) voltage regulator 910 including a plurality of phase voltage regulators 915. The apparatus can also include a plurality of respective thermal sensors 920 operably connected to each of the plurality of phase voltage regulators 915 (e.g. one or more thermal sensor 920 for each corresponding phase voltage regulator 915). Each thermal sensor 920 of the plurality of thermal sensors 920 includes a respective output terminal 925 configured to provide a voltage representative of the temperature of the respective phase voltage regulator 915. The apparatus can further include an output circuit 930 configured to provide the highest temperature information among the phase voltage regulators as an output 935 of the output circuit 930, i.e. to output the highest temperature information among the phase voltage regulators. The output terminals (925) of the plurality of thermal sensors can be tied together (for example, via the output circuit 930).

In the embodiment shown in FIG. 9, each respective phase voltage regulator 915 and thermal sensor 920 corresponding to the respective phase voltage regulator can be provided as a package. The respective phase voltage regulator 915 includes a high-side MOSFET, a low-side MOSFET, and a drive. The temperature sensor 915 is configured to thermally couple (i.e. to couple well enough to perform accurate junction temperature measurement) with the high-side MOSFET and the low-side MOSFET, to detect a combined temperature of the high-side MOSFET and the low-side MOSFET, and to generate a representative voltage corresponding to power consumed in the package at the respective output terminal 925.

In the embodiment illustrated in FIG. 9, each respective thermal sensor 920 can be configured to use silicon PN junction forward voltage temperature dependency. Furthermore, forwarding current can be trimmed to achieve a same forwarding voltage (for thermal sensor that is using Silicon PN junction forward voltage temperature dependency) under fixed temperature conditions. Additionally, the output circuit 930 can either include or be a voltage selector configured to select an extreme (i.e. either the highest or the lowest) voltage of voltages presented at the plurality of output terminals 925 (in the example above, the lowest voltage was of interest, although other embodiments are not excluded).

The voltage selector can include an OP Amp. The positive input of the OP Amp may be connected to the thermal sensor 920, the output of the OP Amp may be coupled to a first terminal of a diode, and the negative terminal of the OP Amp may be connected to a second terminal of the diode. In certain embodiments, each respective thermal sensor 920 may include the optional feature of a disable input 940 (which may also be logically equivalent to an enable input) configured to receive a signal to disable any normal output of the respective thermal sensor 920.

Figure 10:
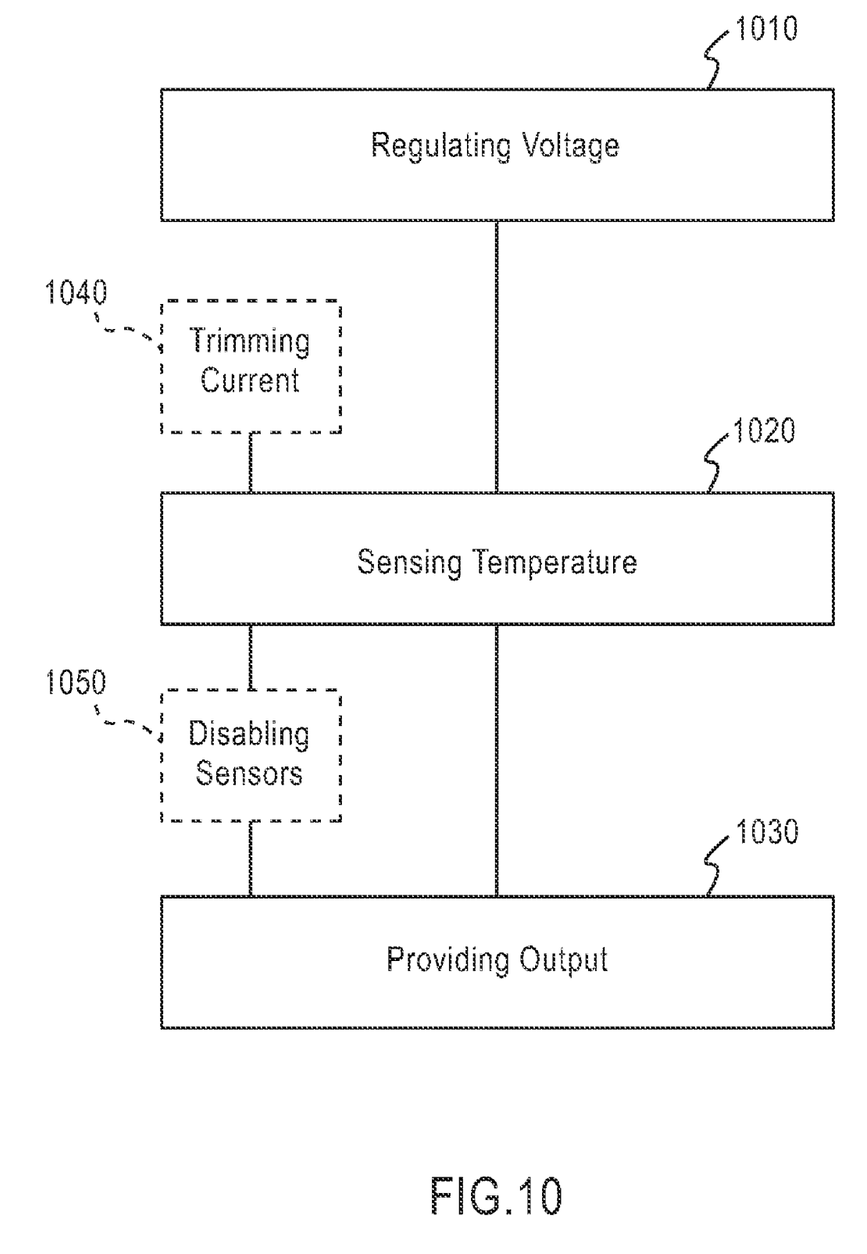
FIG. 10 illustrates a method using a high-level block diagram, in accordance with an embodiment of the present invention.

FIG. 10 illustrates a method according to certain embodiments of the present invention using a high-level block diagram. In the embodiment illustrated in FIG. 10, the method can include regulating voltage 1010 in a multi-part (e.g.

multi-phase and/or multi-rail) voltage regulator including a plurality of phase voltage regulators. The method can also include sensing temperature 1020 with a plurality of thermal sensors respectively, operably connected to each of the plurality of phase voltage regulators. Each thermal sensor of the plurality of thermal sensors includes a respective output terminal configured to provide a voltage representative of the temperature of the respective phase voltage regulator. The output terminals of the plurality of thermal sensors are tied together. The method also includes providing 1030, via an output circuit, an extreme temperature information (for example, the highest temperature information or the lowest temperature information) among the phase voltage regulators as an output of the output circuit.

In certain embodiments of the method shown in FIG. 10, each respective thermal sensor uses Silicon PN junction forward voltage temperature dependency. Additionally, certain embodiments include the optional feature of trimming forwarding current 1040 to achieve a same forwarding voltage under fixed temperature conditions. The method can be performed such that the output circuit provides the highest temperature information using a voltage selector that selects an extreme voltage of voltages presented at the plurality of output terminals.

In certain embodiments of the method shown in FIG. 10, the method may also include disabling 1050 at least one of the plurality of thermal sensors via a respective disable input. The disabling 1050 may include disabling any normal output of the respective thermal sensor (although expressed in terms of disabling, enabling is simply disabling inverted, and consequently should be viewed as the same functionality). This disabling 1050 is an optional feature that does not necessarily have to be included in every embodiment.

When each respective phase voltage regulator and thermal sensor corresponding to the respective phase voltage regulator is provided as a package and the respective phase voltage regulator includes a high-side MOSFET, a low-side MOSFET, and a drive, the method may also include thermally coupling the temperature sensor with the high-side MOSFET and the low-side MOSFET. The method may further include detecting a combined temperature of the high-side MOSFET and the low-side MOSFET. The method may additionally include generating a representative voltage corresponding to power consumed in the package at the respective output terminal.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:

1. An apparatus, comprising:
 a configuration comprising a plurality of heat generation devices;
 a plurality of thermal sensors operably connected to each of the plurality of heat generation devices, respectively, wherein each thermal sensor of the plurality of thermal sensors comprises a respective output terminal configured to provide a voltage representative of the temperature of its respective heat generation device; and
 an output circuit configured to output the highest temperature information among the heat generation devices,
 wherein the output terminals of the plurality of thermal sensors are tied together at a node such that the node is driven to a lowest of the voltages representative of the temperatures of the heat generation devices.

2. The apparatus of claim 1, wherein the configuration comprises a power driving configuration and the heat generation devices comprise semiconductor power devices.

3. The apparatus of claim 1, wherein the configuration comprises a power consuming configuration and the heat generation devices comprise power consuming devices.

4. The apparatus of claim 1, wherein each respective heat generation device and thermal sensor corresponding to the respective heat generation device is provided as a package,
 wherein the respective heat generation device comprises a high-side MOSFET, a low-side MOSFET, and a drive, and
 wherein the temperature sensor is configured to thermally couple with the high-side MOSFET and the low-side MOSFET, to detect a combined temperature of the high-side MOSFET and the low-side MOSFET, and to generate a representative voltage corresponding to power consumed in the package at the respective output terminal.

5. The apparatus of claim 1, wherein each respective thermal sensor is configured to use Silicon PN junction forward voltage temperature dependency.

6. The apparatus of claim 5, wherein forwarding current is trimmed to achieve a same forwarding voltage under fixed temperature conditions.

7. The apparatus of claim 1, wherein the output circuit comprises a voltage selector configured to select an extreme voltage of voltages presented at the plurality of output terminals.

8. The apparatus of claim 7, wherein the voltage selector comprises an OP Amp, wherein the positive input of the OP Amp is connected to the thermal sensor, the output of the OP Amp is coupled to a first terminal of a diode, and the negative terminal of the OP Amp is connected to a second terminal of the diode.

9. The apparatus of claim 1, wherein the configuration is a multi-phase voltage regulator or a multi-rail voltage regulator.

10. The apparatus of claim 1, wherein each respective thermal sensor comprises a disable input configured to receive a signal to disable any normal output of the respective thermal sensor.

11. An apparatus, comprising: a multi-part voltage regulation means for regulating voltage, comprising a plurality of phase voltage regulating means for regulating voltage of a respective phase; a plurality of thermal sensing means for sensing temperature operably connected to each of the plurality of phase voltage regulating means, respectively, wherein each thermal sensing means of the plurality of thermal sensing means comprises a respective output provision means for providing a voltage representative of the temperature of the respective phase voltage regulating means; and an output means for outputting the highest temperature information among the phase voltage regulating means, wherein the output provision means of the plurality of thermal sensing means are tied together at a node such that the node is driven to a lowest of the voltages representative of the temperatures of the phase voltage regulating means.

12. A method, comprising: consuming power by a plurality of nodes daisy chain connected by at least one wire; sensing temperature with a plurality of thermal sensors operably connected to each of the plurality of nodes, respectively, wherein each thermal sensor of the plurality of thermal sensors comprises a respective output terminal configured to provide a voltage representative of the temperature of the respective node, wherein the output terminals of the plurality of thermal sensors are tied together at a common node such that the common node is driven to a lowest of the voltages representative of the temperatures; and outputting, via an output circuit, an extreme temperature information among the nodes.

13. The method of claim 12, wherein each respective thermal sensor uses Silicon PN junction forward voltage temperature dependency.

14. The method of claim 13, further comprising: trimming forwarding current to achieve a same forwarding voltage under fixed temperature conditions.

15. The method of claim 12, wherein the output circuit provides the highest temperature information using a voltage selector that selects an extreme voltage of voltages presented at the plurality of output terminals.

16. The method of claim 12, further comprising: outputting, via an output circuit, the lowest temperature information among the nodes.

17. The method of claim 12, further comprising: disabling at least one of the plurality of thermal sensors via a respective disable input wherein the disabling comprises disabling any normal output of the respective thermal sensor.

18. The method of claim 12, wherein the method is realized in devices having at least three terminals comprising Vcc, GND, and the output terminals, wherein the output terminals are configured to provide the voltage representative of the respective node, wherein the output terminals are tied together, the method further comprising: and outputting the highest or lowest temperature information among the nodes.

* * * * *